(12) United States Patent
Utsunomiya

(10) Patent No.: US 8,907,717 B2
(45) Date of Patent: Dec. 9, 2014

(54) LIGHT RECEIVING CIRCUIT

(71) Applicant: Seiko Instruments Inc., Chiba-shi, Chiba (JP)

(72) Inventor: Fumiyasu Utsunomiya, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 14/213,389

(22) Filed: Mar. 14, 2014

(65) Prior Publication Data

US 2014/0266368 A1    Sep. 18, 2014

(30) Foreign Application Priority Data

Mar. 18, 2013 (JP) ................................. 2013-055357

(51) Int. Cl.
*H01L 31/00* (2006.01)
*H03K 5/153* (2006.01)

(52) U.S. Cl.
CPC ........................................ *H03K 5/153* (2013.01)
USPC ..... 327/514; 250/206; 250/208.1; 250/208.4; 257/292; 257/431

(58) Field of Classification Search
USPC ................. 327/208, 187, 369, 509, 514, 515; 250/206, 208.1, 208.2, 208.4; 257/444, 257/292, 21, 414, 431, 432; 345/156, 163, 345/166; 348/294
See application file for complete search history.

(56) References Cited

U.S. PATENT DOCUMENTS

| | | | | |
|---|---|---|---|---|
| 3,813,565 A | * | 5/1974 | Guilleux | 327/509 |
| 3,911,268 A | * | 10/1975 | Mori et al. | 250/206 |
| 4,952,796 A | * | 8/1990 | Fruhauf et al. | 250/214 R |
| 8,304,706 B2 | * | 11/2012 | Utsunomiya | 250/206 |
| 8,334,844 B2 | * | 12/2012 | Utsunomiya | 345/166 |
| 8,536,673 B2 | * | 9/2013 | Utsunomiya et al. | 257/444 |
| 8,748,790 B2 | * | 6/2014 | Utsunomiya et al. | 250/208.1 |
| 2008/0030258 A1 | * | 2/2008 | Komiya | 327/509 |
| 2009/0251168 A1 | * | 10/2009 | Lisart et al. | 326/8 |
| 2011/0234302 A1 | * | 9/2011 | Utsunomiya et al. | 327/514 |

FOREIGN PATENT DOCUMENTS

JP          09-083452 A        3/1997

* cited by examiner

*Primary Examiner* — Lincoln Donovan
*Assistant Examiner* — Thomas Skibinski
(74) *Attorney, Agent, or Firm* — Brinks Gilson & Lione

(57) ABSTRACT

The light receiving circuit includes: a photoelectric conversion element for causing a current corresponding to an amount of incident light to flow; a MOS transistor including a source connected to the photoelectric conversion element and a drain connected to a node, for causing the current of the photoelectric conversion element to flow to the node while maintaining a voltage of the source to a first voltage; a reset circuit for causing a current to flow from the node to a GND terminal so that a voltage of the node becomes a second voltage lower than the first voltage; a control circuit for outputting a reset signal to the reset circuit; and a voltage increase detection circuit for detecting a fluctuation in the voltage of the node and outputting a detection result.

4 Claims, 4 Drawing Sheets

LIGHT RECEIVING CIRCUIT

RELATED APPLICATIONS

This application claims priority under 35 U.S.C. §119 to Japanese Patent Application No. 2013-055357 filed on Mar. 18, 2013, the entire content of which is hereby incorporated by reference.

BACKGROUND OF THE INVENTION

1. Field of the Invention

The present invention relates to a light receiving circuit for detecting a change in amount of light, and more particularly, to a light receiving circuit capable of stable detection of a change in amount of light regardless of ambient light conditions.

2. Description of the Related Art

Light receiving circuits are used for receiving optical signals in infrared remote control communications or visible light communications and used for photointerrupters, distance sensors, and the like. The light receiving circuit needs to function to detect an abrupt change in amount of light generated when an LED or the like is turned on without detecting a slow change in amount of light generated when a person moves or an object swings in the wind or a change in amount of light of a fluorescent lamp whose brightness fluctuates with a period of 50 Hz. It is also important for the light receiving circuit to maintain light receiving sensitivity regardless of ambient light conditions.

FIG. 6 illustrates a block diagram of a related-art light receiving circuit. The related-art light receiving circuit includes a photodiode 101, a resistive element 601, a low pass filter 603, and an NMOS transistor 602.

The photodiode 101 has an N-type terminal connected to a VDD terminal, and a P-type terminal connected to an output terminal 604 and one electrode of the resistive element 601. The other electrode of the resistive element 601 is connected to a GND terminal. The low pass filter 603 has an input terminal 610 connected to the one electrode of the resistive element 601 and an output terminal 611 connected to a gate of the NMOS transistor 602. The NMOS transistor 602 has a drain connected to the one electrode of the resistive element 601 and a source connected to the GND terminal. The output terminal 604 is connected to the one electrode of the resistive element 601.

The light receiving circuit having the above-mentioned configuration operates as follows to detect a change in amount of incident light.

When the environment is dark, no steady current flows through the photodiode 101, and hence a voltage at the output terminal 604 becomes a GND terminal voltage and the NMOS transistor 602 is off. When the photodiode 101 is irradiated with light of an LED or the like, a current is generated in the photodiode 101. This current flows through the resistive element 601 to generate a voltage. When this voltage is output to the output terminal 604, it can be detected that the amount of incident light has changed.

When the environment is bright, a steady current flows through the photodiode 101. The voltage of the output terminal 604 increases because the current flows through the resistive element 601. When the voltage of the output terminal 604 exceeds a threshold voltage of the NMOS transistor 602, the NMOS transistor 602 is turned on. Thus, the voltage of the output terminal 604 is controlled to be around the threshold voltage of the NMOS transistor 602. In other words, no matter how bright the environment is, the voltage of the output terminal 604 increases at most to around the threshold voltage of the NMOS transistor 602. When the photodiode 101 is irradiated with light of an LED or the like, the current of the photodiode 101 increases. In this case, because a gate voltage of the NMOS transistor 602 changes via the low pass filter 603, the instantaneously-changing current flows only through the resistive element 601. Thus, this current increases the voltage of the resistive element 601, thereby increasing the voltage of the output terminal 604. Then, when the voltage of the output terminal 604 becomes equal to or higher than a predetermined voltage, it can be detected that the amount of incident light has changed.

As described above, the related-art light receiving circuit includes the low pass filter 603 and the NMOS transistor 602, and consequently the light receiving sensitivity is not affected by the ambient light conditions (see, for example, Japanese Patent Application Laid-open No. Hei 09-083452).

In the related-art light receiving circuit, however, a large parasitic capacitance of the photodiode, a wiring capacitance, and the like are present at the node between the photodiode and the resistor, thus decreasing a voltage increase rate at the node whose voltage is increased by the current of the photodiode. Thus, when an LED or the like is turned on at a distant location, a generated current of the photodiode is small and the voltage increase rate at the node is slow, and hence the NMOS transistor causes the current of the photodiode to flow before the voltage of the node reaches a predetermined value. In other words, the related-art light receiving circuit has a problem of low sensitivity.

SUMMARY OF THE INVENTION

In order to solve the problem of the related art, a light receiving circuit according to one embodiment of the present invention includes: a photoelectric conversion element for causing a current corresponding to an amount of incident light to flow; a MOS transistor including a source connected to the photoelectric conversion element and a drain connected to a node, for causing the current of the photoelectric conversion element to flow to the node while maintaining a voltage of the source to a first voltage; a reset circuit for causing a current to flow from the node to a GND terminal so that a voltage of the node becomes a second voltage lower than the first voltage; a control circuit for outputting a reset signal to the reset circuit; and a voltage increase detection circuit for detecting a fluctuation in the voltage of the node and outputting a detection result. The reset circuit is configured to cause, when the reset signal of the control circuit is input, the current to flow from the node to the GND terminal so that the voltage of the node becomes the second voltage, and to hold this state when the reset signal is no longer input.

The light receiving circuit according to one embodiment of the present invention is capable of detecting only an abrupt change in amount of light with high sensitivity and is low in current consumption, low in cost, and small in size.

DETAILED DESCRIPTION OF THE PREFERRED EMBODIMENT

Now, a description is given of a light receiving circuit according to an embodiment of the present invention with reference to the attached drawings.

Figure 1:
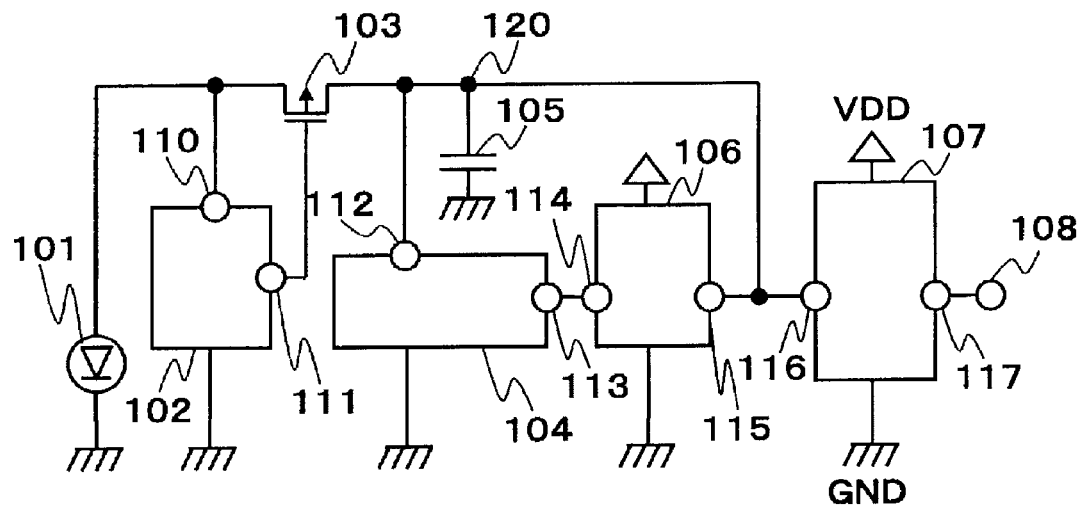
FIG. 1 is a block diagram illustrating a light receiving circuit according to an embodiment of the present invention.

FIG. 1 is a block diagram illustrating the light receiving circuit according to this embodiment.

The light receiving circuit according to this embodiment includes a photodiode 101, a voltage output circuit 102, a PMOS transistor 103, a reset circuit 112, a capacitor 105, a voltage detection circuit 106, and a voltage increase detection circuit 107.

The photodiode 101 has an N-type terminal connected to a GND terminal and a P-type terminal connected to a source of the PMOS transistor 103 and an input terminal 110 of the voltage output circuit 102. The PMOS transistor 103 has a gate connected to an output terminal 111 of the voltage output circuit 102 and a drain connected to a node 120. The reset circuit 104 has a reset terminal 112 connected to the node 120 and an input terminal 113 connected to an output terminal 114 of the voltage detection circuit 106. The capacitor 105 has one terminal connected to the node 120 and the other terminal connected to the GND terminal. The voltage detection circuit 106 has an input terminal 115 connected to the node 120. The voltage increase detection circuit 107 has an input terminal 116 connected to the node 120 and an output terminal 117 connected to an output terminal 108 of the light receiving circuit.

The photodiode 101, which is a photoelectric conversion element, outputs a current corresponding to an amount of incident light. When a voltage of the node 120 is equal to or higher than a detection voltage, the voltage detection circuit 106 outputs a signal of "Low" from the output terminal 114. When the voltage of the node 120 is lower than the detection voltage, the voltage detection circuit 106 outputs a signal of "High" from the output terminal 114. When the signal of "Low" is input to the input terminal 113, the reset circuit 104 causes a current to flow from the reset terminal 112 to the GND terminal, thereby decreasing the voltage of the node 120 connected to the reset terminal 112 to a reset voltage. When the signal of "High" is input to the input terminal 113, the reset circuit 104 holds the state at that time, thereby maintaining the voltage of the node 120 at the reset voltage. The reset voltage is set to be lower than the detection voltage of the voltage detection circuit 106. The voltage output circuit 102 outputs a voltage to the gate of the PMOS transistor 103 from the output terminal 111 so that a source voltage of the PMOS transistor 103 through which the current flows may become higher than the detection voltage of the voltage detection circuit 106. The voltage increase rate at the node 120 is determined by an increased amount of the current generated in the photodiode 101 and a capacitance value of the capacitor 105. In this case, the capacitance value of the capacitor 105 is set to be small.

The light receiving circuit according to this embodiment configured as described above operates as follows to detect a change in amount of incident light.

When the environment is dark, no voltage or current is generated in the photodiode 101, and hence the source of the PMOS transistor 103 and the node 120 each have a voltage of the GND terminal (reference voltage). In this state, when a light signal enters the photodiode 101 or when the environment suddenly becomes brighter to generate the voltage and current in the photodiode 101, the source voltage of the PMOS transistor 103 is increased. When the increasing source voltage of the PMOS transistor 103 becomes equal to or higher than a voltage that turns on the PMOS transistor 103, the current of the photodiode 101 charges the capacitor 105. When the voltage of the node 120 increases to reach the detection voltage of the voltage detection circuit 106, the voltage detection circuit 106 outputs the signal of "Low" to the reset circuit 104. When receiving the signal of "Low" from the voltage detection circuit 106, the reset circuit 104 causes the current of the photodiode 101 to flow to the GND terminal. The voltage of the node 120 decreases accordingly. When the voltage of the node 120 decreases to be lower than the detection voltage of the voltage detection circuit 106, the voltage detection circuit 106 outputs the signal of "High" to the reset circuit 104. When receiving the signal of "High", the reset circuit 104 holds the state at that time. The reset circuit 104 holds this state while the signal of "High" is input to the input terminal 113. The voltage increase detection circuit 107 detects the increase rate of the voltage of the node 120 input to the input terminal 116. When the voltage increase rate is equal to or larger than a predetermined value, the voltage increase detection circuit 107 outputs a signal of "High" from the output terminal 117. When the voltage increase rate is smaller than the predetermined value, the voltage increase detection circuit 107 outputs a signal of "Low" from the output terminal 117. The signal output from the output terminal 117 of the voltage increase detection circuit 107 is output as a detection signal from the output terminal 108 of the light receiving circuit.

When the environment is bright, a constant current flows through the photodiode 101. Thus, the source voltage of the PMOS transistor 103 becomes a voltage that causes the current of the photodiode 101 to flow to the PMOS transistor 103. Further, because a current corresponding to the ambient light conditions is caused to flow through the node 120 by the reset circuit 104 as described above, the node 120 is maintained at the reset voltage. In this state, when a light signal enters the photodiode 101 or when the environment suddenly becomes brighter, the current of the photodiode 101 increases. The source voltage of the PMOS transistor 103 increases slightly in order for the PMOS transistor 103 to cause the increased amount of the current to flow. Then, the PMOS transistor 103 causes a current including the increased amount of the current of the photodiode 101 to directly flow to the node 120.

On the other hand, when the amount of light entering the photodiode 101 changes slowly, such as when a person moves or a curtain waves under the bright environment, the current of the photodiode 101 also increases slowly. Thus, the capacitor 105 starts to be charged with a very small increased current of the photodiode that is generated at an initial timing of the start of increase through the PMOS transistor 103. However, because the capacitance value of the capacitor 105 is small, the voltage of the node 120 increases instantly even with such very small current. Thus, the voltage of the node 120 reaches the detection voltage of the voltage detection circuit 106 before the current of the photodiode 101 is increased. The subsequent operation is the same as that in the above-mentioned case where the environment is dark. Then, when the current of the photodiode 101 changes slowly, the voltage increase rate at the node 120 becomes smaller than the voltage increase rate detected by the voltage increase detection circuit 107 and is therefore not detected as a change in amount of light entering the photodiode 101.

Figure 2:
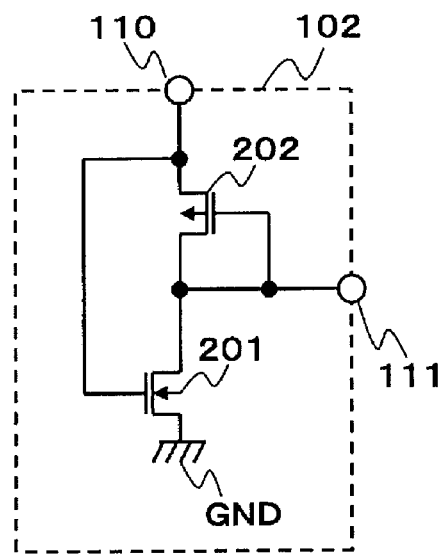
FIG. 2 is a circuit diagram illustrating an example of a voltage output circuit of the light receiving circuit according to the embodiment of the present invention.

FIG. 2 is a circuit diagram illustrating an example of the voltage output circuit 102 of the light receiving circuit according to this embodiment.

The voltage output circuit 102 includes the input terminal 110, the output terminal 111, an NMOS transistor 201, and a PMOS transistor 202.

The input terminal 110 is connected to a gate of the NMOS transistor 201 and a source of the PMOS transistor 202. The NMOS transistor 201 has a source connected to the GND terminal, and a drain connected to the output terminal 111 and a gate and a drain of the PMOS transistor 202.

When the voltage of the input terminal 110 is higher than a threshold voltage of the NMOS transistor 201 and the absolute value of a threshold voltage of the PMOS transistor 202, a current flows through each transistor, and a voltage determined by subtracting the absolute value of the threshold voltage of the PMOS transistor 202 from the voltage of the input terminal 110 is output from the output terminal 111. Thus, when the source voltage of the PMOS transistor 103 connected to the input terminal 110 is higher than the threshold voltage of the NMOS transistor 201 and the absolute value of the threshold voltage of the PMOS transistor 202 illustrated in FIG. 2, the PMOS transistor 103 is turned on.

Figure 3:
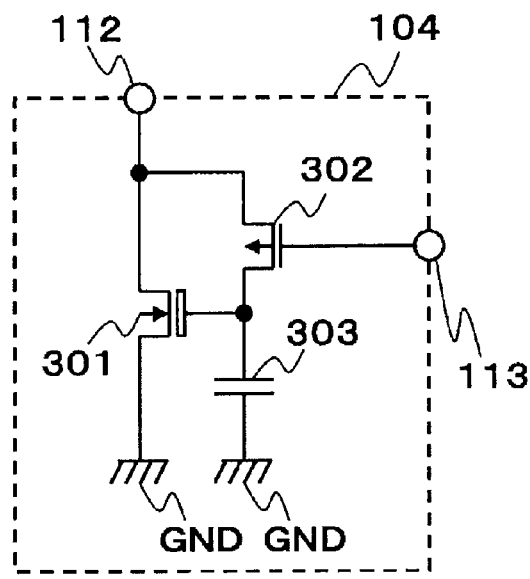
FIG. 3 is a circuit diagram illustrating an example of a reset circuit of the light receiving circuit according to the embodiment of the present invention.

FIG. 3 is a circuit diagram illustrating an example of the reset circuit 104 of the light receiving circuit according to this embodiment.

The reset circuit 104 includes the reset terminal 112, a low-threshold NMOS transistor 301, a PMOS transistor 302, a capacitor 303, and the input terminal 113.

The reset terminal 112 is connected to a drain of the low-threshold NMOS transistor 301 and a source of the PMOS transistor 302. The low-threshold NMOS transistor 301 has a source connected to the GND terminal, and a gate connected to a drain of the PMOS transistor 302 and one terminal of the capacitor 303. The other terminal of the capacitor 303 is connected to the GND terminal. The PMOS transistor 302 has a gate connected to the input terminal 113.

When a signal of "Low" is input to the input terminal 113, the PMOS transistor 302 is turned on, and hence the low-threshold NMOS transistor 301 is saturation-connected. Accordingly, the reset terminal 112 and the node 120 are reset to around a threshold voltage of the low-threshold NMOS transistor 301.

On the other hand, when a signal of "High" is input to the input terminal 113, the PMOS transistor 302 is turned off, and a gate voltage of the low-threshold NMOS transistor 301 is maintained by the capacitor 303. In other words, the low-threshold NMOS transistor 301 maintains a current that flows when the signal of "High" is input. Thus, when the current of the photodiode 101 does not change, the reset terminal 112 and the node 120 each maintain the reset voltage. Then, when the current of the photodiode 101 increases from this state, the low-threshold NMOS transistor 301 cannot cause a current corresponding to the increased amount to flow. Thus, the increased amount of the current of the photodiode 101 charges the capacitor 105 through the PMOS transistor 103, thereby increasing the voltage of the node 120.

Figure 4:
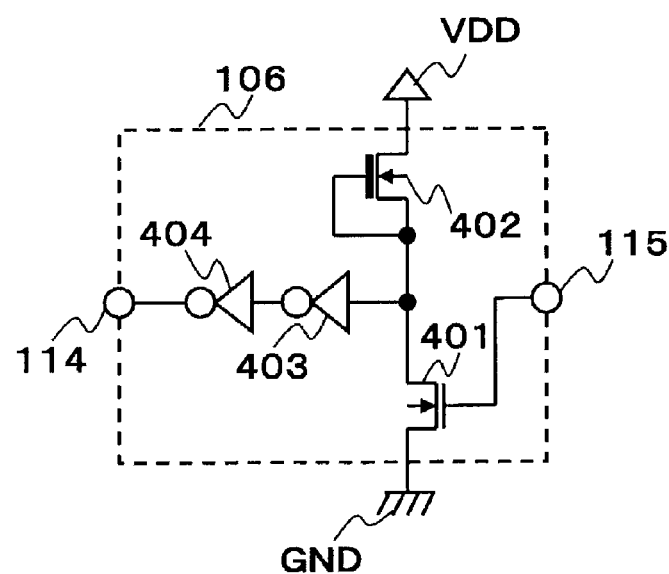
FIG. 4 is a circuit diagram illustrating an example of a voltage detection circuit of the light receiving circuit according to the embodiment of the present invention.

FIG. 4 is a circuit diagram illustrating an example of the voltage detection circuit 106 of the light receiving circuit according to this embodiment.

The voltage detection circuit 106 includes the input terminal 115, an NMOS transistor 401, a depletion type NMOS transistor 402, an inverter circuit 403, and an inverter circuit 404.

The input terminal 115 is connected to a gate of the NMOS transistor 401. The NMOS transistor 401 has a source connected to the GND terminal, and a drain connected to a source and a gate of the depletion type NMOS transistor 402 and an input terminal of the inverter circuit 403. The depletion type NMOS transistor 402 has a drain connected to the VDD terminal. The inverter 403 has an output terminal connected to an input terminal of the inverter circuit 404. The inverter circuit 404 has an output terminal connected to the output terminal 114.

When the voltage of the input terminal 115 increases so that the current of the NMOS transistor 401 becomes larger than a constant current supplied by the depletion type NMOS transistor 402, the input terminal of the inverter circuit 403 is changed from "High" level to "Low" level, and the input terminal of the inverter circuit 404 is changed from "Low" level to "High" level. In response thereto, the output terminal of the inverter circuit 404 is changed from "High" level to "Low" level, and hence a signal of "Low" is output from the output terminal 114 that has output a signal of "High". Note that, the input terminal of the inverter circuit 403 is changed from "High" level to "Low" level quickly, but is changed from "Low" level to "High" level slowly because the constant current supplied by the depletion type NMOS transistor 402 is small. Thus, the period during which the signal of "Low" is output from the output terminal 114 becomes longer, and the reset circuit 113 continues the reset state once the reset state is established. Consequently, the reset circuit 113 can reset the node 120 reliably.

Figure 5:
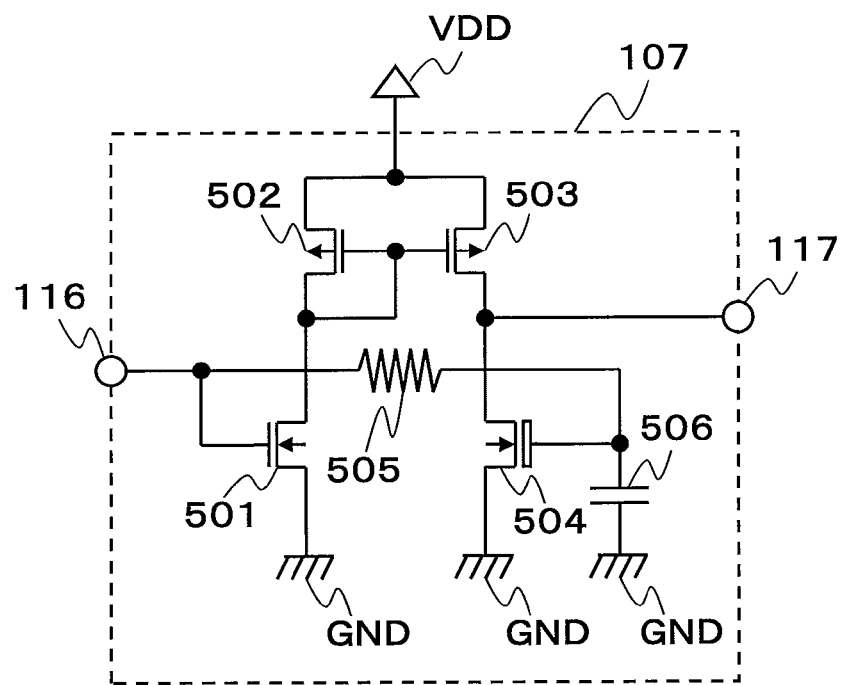
FIG. 5 is a circuit diagram illustrating an example of a voltage increase detection circuit of the light receiving circuit according to the embodiment of the present invention.
Figure 6:
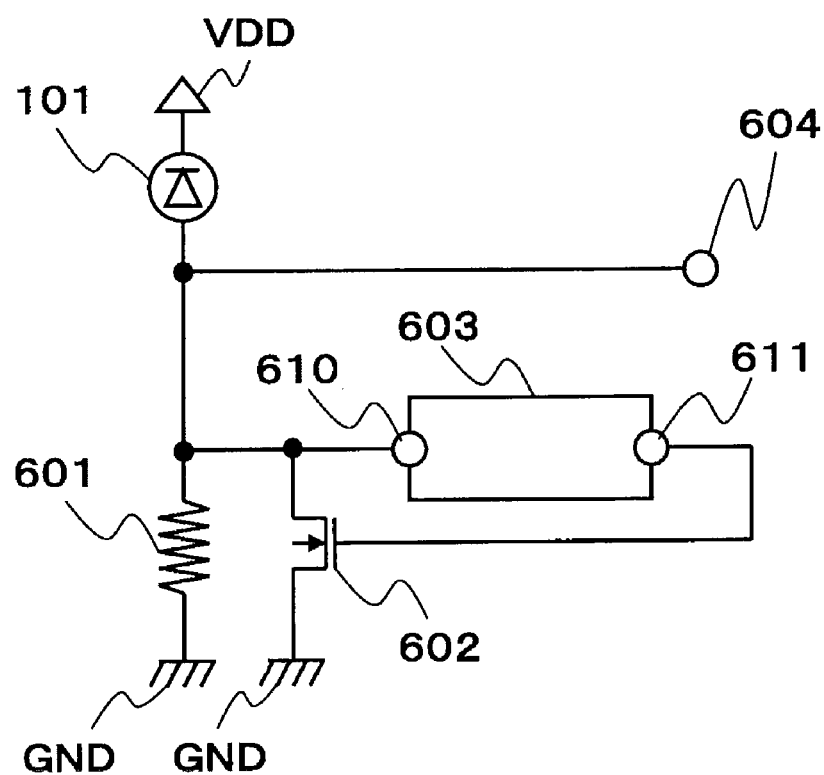
FIG. 6 is a block diagram illustrating a related-art light receiving circuit.

FIG. 5 is a circuit diagram illustrating an example of the voltage increase detection circuit 107 of the light receiving circuit according to this embodiment.

The voltage increase detection circuit 107 includes the input terminal 116, an NMOS transistor 501, and a PMOS transistor 502. The voltage increase detection circuit 107 further includes a PMOS transistor 503, a low-threshold NMOS transistor 504, a resistor 505, a capacitor 506, and the output terminal 117.

The input terminal 116 is connected to a gate of the NMOS transistor 501 and one terminal of the resistor 505. The other terminal of the resistor 505 is connected to a gate of the low-threshold NMOS transistor 504 and one terminal of the capacitor 506. The other terminal of the capacitor 506 is connected to the GND terminal. The NMOS transistor 501 has a source connected to the GND terminal, and a drain connected to a drain and a gate of the PMOS transistor 502 and a gate of the PMOS transistor 503. The PMOS transistor 502 has a source connected to the VDD terminal. The PMOS transistor 503 has a source connected to the VDD terminal, and a drain connected to the output terminal 117 and a drain of the low-threshold NMOS transistor 504. The low-threshold NMOS transistor 504 has a source connected to the GND terminal.

A current of the NMOS transistor 501 is mirrored from the PMOS transistor 502 to the PMOS transistor 503 by a current mirror circuit constructed by the PMOS transistor 502 and the PMOS transistor 503, and is compared to a current of the low-threshold NMOS transistor 504. When the current of the NMOS transistor 501 is larger than the current of the low-threshold NMOS transistor 504, a signal of "High" is output from the output terminal 117. On the other hand, when the current of the NMOS transistor 501 is smaller than the current of the low-threshold NMOS transistor 504, a signal of "Low" is output from the output terminal 117. A voltage generated across the resistor 505 increases in proportion to the voltage increase rate at the input terminal 116. When the voltage of the input terminal 116 increases at such a rate that the voltage generated across the resistor 505 becomes larger than a threshold difference between the NMOS transistor 501 and the low-threshold NMOS transistor 504, a signal of "High" is output from the output terminal 117, which normally outputs a signal of "Low".

As described above, the light receiving circuit according to this embodiment determines that the amount of light entering the photodiode has changed based on the voltage increase rate at the internal node through the PMOS transistor. Even when an increase in current of the photodiode is minute, the voltage at the internal node abruptly increases as long as the change rate of the current is steep. Consequently, a highly-sensitive light receiving circuit can be provided.

Further, the light receiving circuit according to this embodiment is configured so that the voltage level of the node for detecting the voltage increase rate caused by an increased current of the photodiode is controlled to the reset voltage by the reset circuit when the voltage of the node increases to a predetermined voltage. This configuration eliminates the need of providing a low pass filter, which is responsible for an increase in area and a reduction in detection sensitivity. Consequently, a highly-sensitive light receiving circuit with a small circuit area can be provided.

Still further, the photodiode is configured so that the N-type terminal is connected to the GND terminal to detect a change in current output from the P-type terminal. Consequently, because the current of the photodiode does not flow from the VDD terminal to the GND terminal, there is another effect that the light receiving circuit can be reduced in current consumption.

While the light receiving circuit according to this embodiment has been described by way of the photodiode 101, it is to be noted that the same functions and features can be obtained even with the use of a photoelectric conversion element having photoelectric conversion characteristics, such as an LED and a solar cell. Further, although the capacitor 105 is provided for the purpose of adjusting the voltage increase rate at the node 120 in the light receiving circuit according to this embodiment, the capacitor 105 may not be provided unless the adjustment is particularly needed.

Still further, although the light receiving circuit according to this embodiment is configured so that the reset circuit 104 is controlled by the detection signal of the voltage detection circuit 106, the present invention is not limited to this configuration as long as the voltage of the node 120 is adjusted to the reset voltage. For example, a control circuit such as a timer circuit may be provided so that a reset signal may be output to the reset circuit 104 periodically as a control signal.

It is also to be noted that the above-mentioned functions and features can be obtained even when each NMOS transistor is changed to a PMOS transistor and each PMOS transistor is changed to an NMOS transistor.

What is claimed is:

1. A light receiving circuit, comprising:
   a photoelectric conversion element for causing a current corresponding to an amount of incident light to flow;
   a MOS transistor including a source connected to the photoelectric conversion element and a drain connected to a node, for causing the current of the photoelectric conversion element to flow to the node while maintaining a voltage of the source to a first voltage;
   a reset circuit for causing a current to flow from the node to a GND terminal so that a voltage of the node becomes a second voltage lower than the first voltage;
   a control circuit for outputting a reset signal to the reset circuit; and
   a voltage increase detection circuit for detecting a fluctuation in the voltage of the node and outputting a detection result,
   the reset circuit being configured to cause, when the reset signal of the control circuit is input, the current to flow from the node to the GND terminal so that the voltage of the node becomes the second voltage, and to hold this state when the reset signal is no longer input.

2. A light receiving circuit according to claim 1, wherein:
   the reset circuit includes a reset terminal connected to the node and an input terminal connected to an output terminal of the voltage detection circuit;
   the reset circuit comprises:
      a low-threshold NMOS transistor including a drain connected to the reset terminal, a source connected to the GND terminal, and a gate connected to the GND terminal via a capacitor; and
      a PMOS transistor including a source connected to the reset terminal, a drain connected to a gate of the low-threshold NMOS transistor, and a gate connected to the input terminal; and
   the PMOS transistor is turned on when the detection signal of the voltage detection circuit is input to the input terminal.

3. A light receiving circuit according to claim 1, wherein the photoelectric conversion element comprises a PN diode, including an N-type terminal connected to the GND terminal and a P-type terminal connected to a source of the MOS transistor.

4. A light receiving circuit according to claim 2, wherein the photoelectric conversion element comprises a PN diode, including an N-type terminal connected to the GND terminal and a P-type terminal connected to a source of the MOS transistor.

* * * * *